(12) United States Patent
Gong et al.

(10) Patent No.: US 10,826,507 B1
(45) Date of Patent: Nov. 3, 2020

(54) FRACTIONAL DIVIDER WITH ERROR CORRECTION

(71) Applicant: Silicon Laboratories Inc., Austin, TX (US)

(72) Inventors: Xue-Mei Gong, Austin, TX (US); James D. Barnette, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/404,056

(22) Filed: May 6, 2019

(51) Int. Cl.
| | | |
|---|---|---|
| H03L 7/197 | (2006.01) | |
| H03L 7/093 | (2006.01) | |
| H03L 7/099 | (2006.01) | |
| H04L 7/033 | (2006.01) | |
| H04L 7/04 | (2006.01) | |

(52) U.S. Cl.
CPC ............ *H03L 7/1974* (2013.01); *H03L 7/093* (2013.01); *H03L 7/0992* (2013.01); *H04L 7/0331* (2013.01); *H04L 7/048* (2013.01)

(58) Field of Classification Search
CPC ... H03L 7/06; H03L 7/08; H03L 7/085; H03L 7/093; H03L 7/099; H03L 7/0991; H03L 7/0992; H03L 7/0993; H03L 7/0994; H03L 7/16; H03L 7/18; H03L 7/197; H03L 7/1972; H03L 7/1974; H03L 7/1976; H03L 7/1978; H03L 7/199; H03L 7/20; H03L 7/22; H03L 7/23; H03L 7/235; H04L 7/02; H04L 7/033; H04L 7/0331; H04L 7/04; H04L 7/048
See application file for complete search history.

(56) References Cited

U.S. PATENT DOCUMENTS

| | | | |
|---|---|---|---|
| 6,590,426 B2 | 7/2003 | Perrott | |
| 6,741,109 B1 | 5/2004 | Huang et al. | |
| 7,405,628 B2 | 7/2008 | Hulfachor et al. | |
| 7,417,510 B2 | 8/2008 | Huang | |
| 7,463,098 B2 | 12/2008 | Baird et al. | |
| 7,613,267 B2 | 11/2009 | Perrott et al. | |
| 7,777,585 B1 | 8/2010 | Sonntag | |
| 8,441,291 B2 | 5/2013 | Hara et al. | |
| 8,441,575 B2 | 5/2013 | Wang | |
| 8,514,118 B2 | 8/2013 | Eldredge | |
| 8,786,341 B1 | 7/2014 | Weltin-Wu et al. | |
| 8,791,734 B1 | 7/2014 | Hara et al. | |
| 8,692,599 B2 | 8/2014 | Gong et al. | |
| 9,705,514 B2 | 7/2017 | Perrott | |
| 10,067,478 B1 | 9/2018 | Ranganathan | |

(Continued)

OTHER PUBLICATIONS

Silicon Laboratories Inc., "Functional Description," Si5383/84 Rev D Data Sheet, Oct. 2018, 22 pages.

*Primary Examiner* — Diana J. Cheng
(74) *Attorney, Agent, or Firm* — Zagorin Cave LLP

(57) ABSTRACT

A clock product includes a phase-locked loop configured to generate an output clock signal based on an input digital value and a feedback digital value. The input digital value corresponds to a first clock edge of a frequency-divided input clock signal and the feedback digital value corresponds to a second clock edge of a feedback clock signal. The clock product includes an input fractional divider configured to generate the input digital value based on an input clock signal, a divider value, and an input clock period digital code corresponding to a period of the input clock signal.

20 Claims, 4 Drawing Sheets

(56) References Cited

U.S. PATENT DOCUMENTS

| | | | |
|---|---|---|---|
| 2012/0013406 A1* | 1/2012 | Zhu | H03L 7/0992 331/34 |
| 2014/0118033 A1 | 5/2014 | Anker et al. | |
| 2017/0187481 A1 | 6/2017 | Huang et al. | |

* cited by examiner

FRACTIONAL DIVIDER WITH ERROR CORRECTION

BACKGROUND

Field of the Invention

This invention relates to integrated circuits and more particularly to clock generator integrated circuits.

Description of the Related Art

High speed communication systems require high speed clock signals for transmission and reception of information. A typical clock generation circuit includes a phase-locked loop (PLL) that receives a synchronization reference clock signal and generates one or more high speed clock signals suitable for use in transmitting or receiving data. FIG. 1 illustrates a functional block diagram of a conventional analog phase-locked loop including fractional dividers for generating a reference clock signal and a feedback clock signal at target frequencies. Phase-locked loop 100 includes phase/frequency detector 112, which receives reference clock signal REFCLK from fractional frequency divider 110, loop filter 114, and voltage-controlled oscillator 116. Fractional frequency divider 110 and fractional frequency divider 118 divide input clock signal CLKIN and output clock signal CLKOUT, respectively, to generate reference clock signal REFCLK and feedback clocks signal FBCLK at target frequencies.

Fractional frequency divider circuits 110 and 118 use conventional techniques that introduce jitter into the resulting frequency-divided signals, reference clock signal REFCLK and feedback clock signal FBCLK, respectively. As clock signal frequencies increase, the level of jitter that is acceptable in output clock signals decreases. Conventional fractional frequency dividers introduce quantization noise into the input reference clock signal or feedback clock signal and require that the phase-locked loop have a low bandwidth to filter out quantization noise. In general, phase error correction techniques used to address jitter are complex, may introduce spurs into the frequency-divided clock signal, and are expensive. In addition, use of conventional fractional frequency dividers for generating input reference clock signal REFCLK and feedback clock signal FBCLK in a phase-locked loop requires that phase frequency detector 112 support a large full-scale phase range. Accordingly, improved techniques for clock generation are desired.

SUMMARY OF EMBODIMENTS OF THE INVENTION

In at least one embodiment, a clock product includes a phase-locked loop configured to generate an output clock signal based on an input digital value and a feedback digital value. The input digital value corresponds to a first clock edge of a frequency-divided input clock signal and the feedback digital value corresponds to a second clock edge of a feedback clock signal. The clock product includes an input fractional divider configured to generate the input digital value based on an input clock signal, a divider value, and an input clock period digital code corresponding to a period of the input clock signal. The input fractional divider may include an analog divider configured to generate an integer-divided clock signal based on the input clock signal and an integer divider code. The input fractional divider may include a time-to-digital converter configured to generate an integer-divided clock digital value based on the integer-divided clock signal. The input fractional divider may include an error correction circuit configured to generate the integer divider code and a fractional digital value based on the divider value and the input clock period digital code. The input fractional divider may include a summer configured to generate the input digital value based on the integer-divided clock digital value and the fractional digital value.

In at least one embodiment, a method for generating a clock signal includes generating an output clock signal based on an input digital value and a feedback digital value. The input digital value corresponds to a first clock edge of a frequency-divided input clock signal and the feedback digital value corresponds to a second clock edge of a feedback clock signal. The method includes generating the input digital value based on an input clock signal, a divider value, and an input clock period digital code corresponding to a period of the input clock signal. Generating the input digital value may include generating an integer-divided clock signal based on the input clock signal and an integer divider code. Generating the input digital value may include generating an integer-divided clock digital value based on the integer-divided clock signal. Generating the input digital value may include generating the integer divider code and a fractional digital value based on the divider value and the input clock period digital code. Generating the input digital value may include generating the input digital value based on the integer-divided clock digital value and the fractional digital value.

A method for generating a clock signal comprising generating an output clock signal based on an input digital value and a feedback digital value. The input digital value corresponds to a first clock edge of a frequency-divided input clock signal and the feedback digital value corresponds to a second clock edge of a feedback clock signal. The method includes generating the feedback digital value based on the output clock signal, a feedback divider value, and an output clock period digital code corresponding to a period of the output clock signal. Generating the feedback digital value may include generating an integer-divided feedback clock signal based on the feedback clock signal and an integer divider code. Generating the feedback digital value may include generating an integer-divided feedback clock digital value based on the integer-divided feedback clock signal. Generating the feedback digital value may include generating a fractional feedback digital value based on the feedback divider value and the output clock period digital code. Generating the feedback digital value may include generating the feedback digital value based on the integer-divided feedback clock digital value and the fractional feedback digital value.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
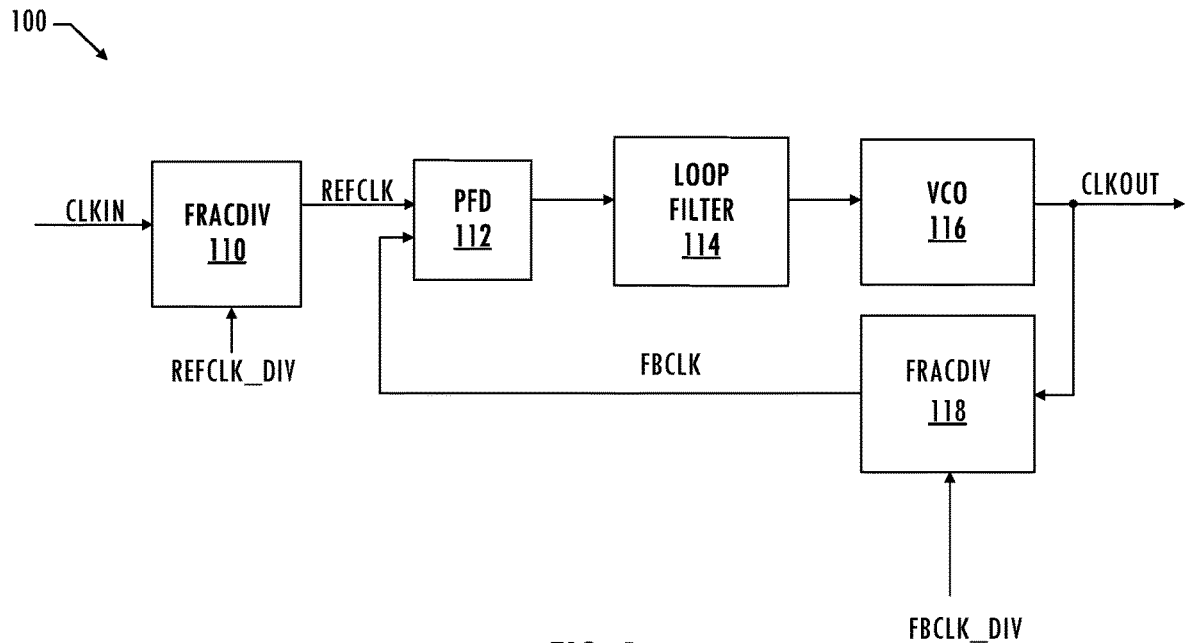
FIG. 1 illustrates a functional block diagram of a conventional analog phase-locked loop including fractional dividers for generating the reference clock signal and the feedback clock signal.
Figure 2:
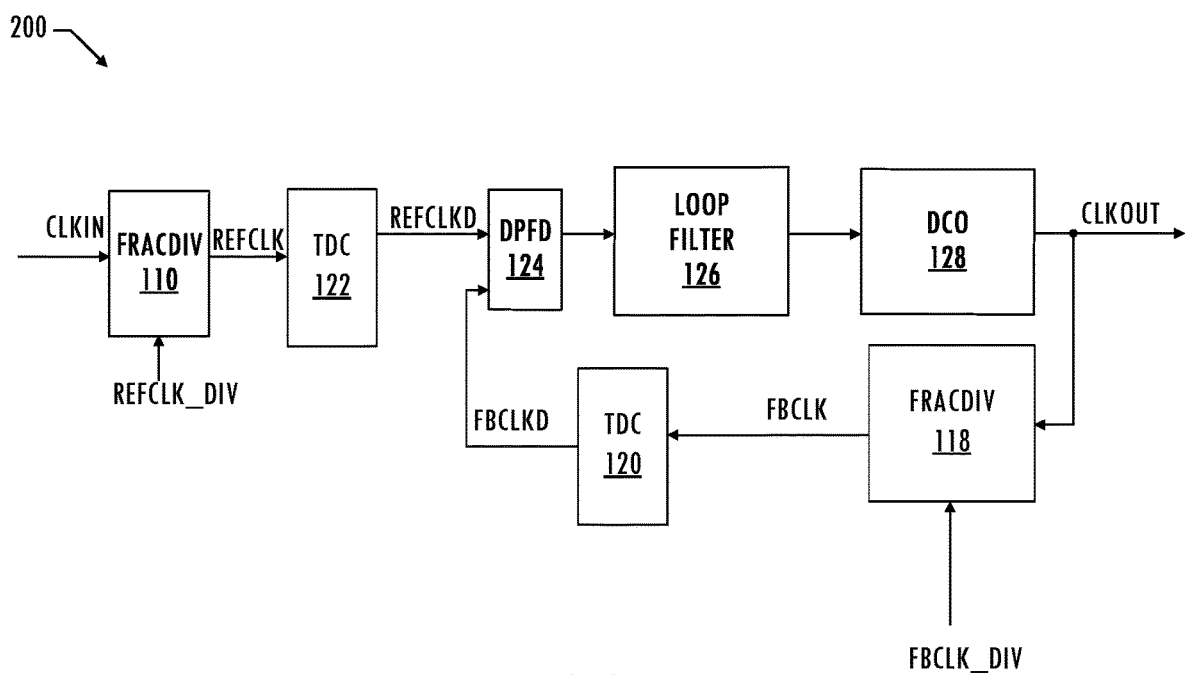
FIG. 2 illustrates a functional block diagram of an exemplary phase-locked loop including a digital phase/frequency detector and conventional fractional frequency dividers for generating the reference clock signal and the feedback clock signal.

Recent improvements to resolution and accuracy of time-to-digital converters facilitate the use of digital phase/frequency detectors in a phase-locked loop for clock generation applications. In general, digital phase/frequency detectors are more flexible and less expensive than analog phase/frequency detectors. FIG. 2 illustrates a functional block diagram of an exemplary phase-locked loop including digital phase/frequency detector 124, digital loop filter 126, digitally-controlled oscillator 128, and conventional fractional frequency dividers, which generate reference clock signal REFCLK and feedback clock signal FBCLK. In at least one embodiment, time-to-digital converters 122 and 120 generate digital reference clock signal REFCLKD and digital feedback clock signal FBCLKD according to divider code REFCLK DIV and divider code FBCLK DIV, respectively. Although digital phase/frequency detector 124 is capable of supporting a wide range of full-scale signals, conventional fractional frequency divider circuits 110 and 118 require phase-locked loop 200 to have a low bandwidth to filter out quantization noise introduced into digital reference clock signal REFCLKD and digital feedback clock signal FBCLKD. However, lower bandwidths are associated with increased accumulated phase error.

Figure 3:
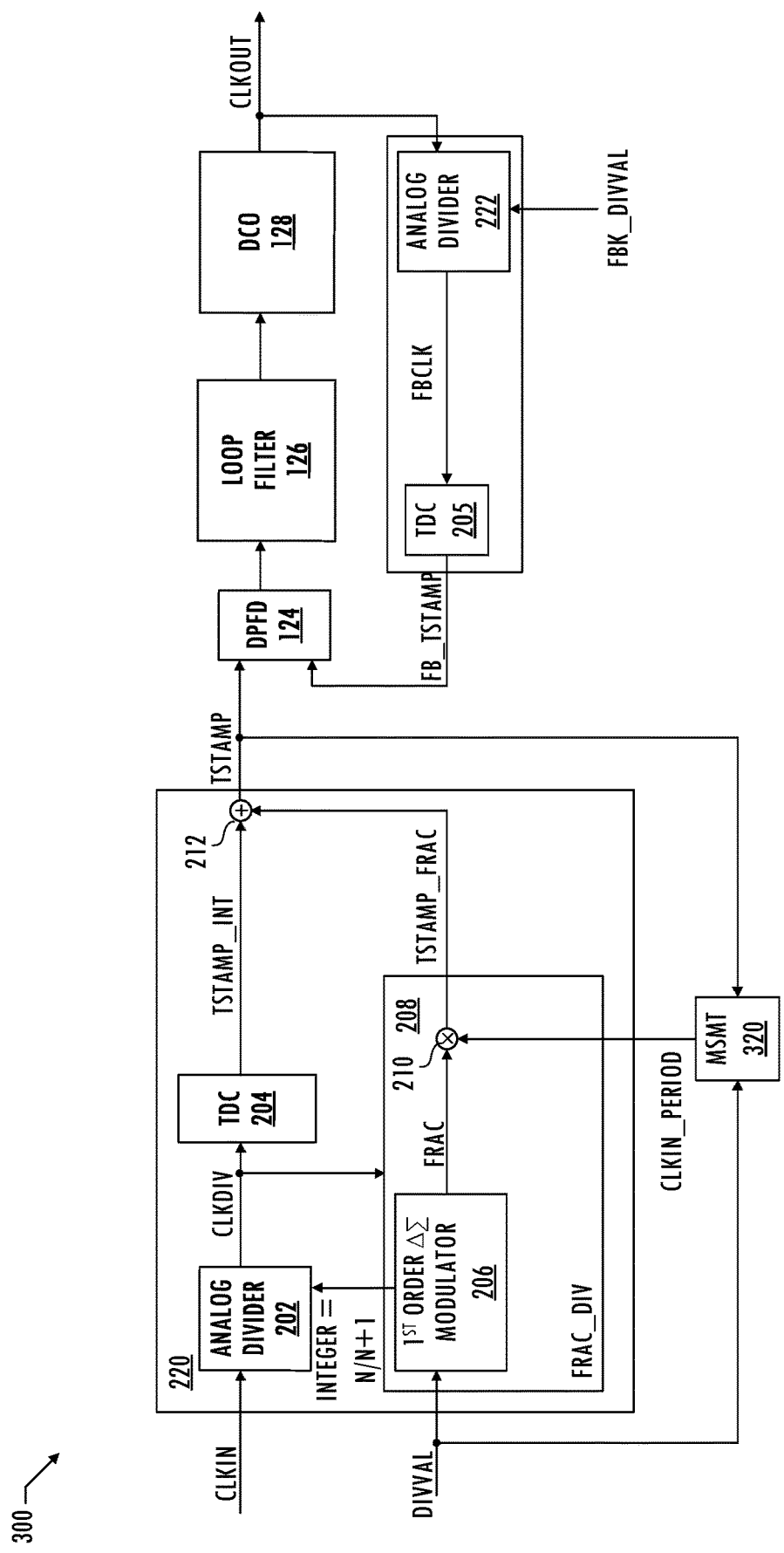
FIG. 3 illustrates a functional block diagram of a phase-locked loop including a digital phase/frequency detector and an input fractional frequency divider with error correction consistent with at least one embodiment of the invention.

FIG. 3 illustrates fractional frequency divider 220 for use with digital phase/frequency detector 124. Fractional frequency divider 220 includes error correction that reduces or eliminates quantization noise introduced into a digital reference clock signal that is provided to phase/frequency detector 124, thereby relaxing bandwidth requirements of phase-locked loop 300 as compared to phase-locked loops using conventional fractional frequency dividers to generate an input digital signal. Divider code DIVVAL represents a real number having an integer portion and a fractional portion that indicates a divider ratio for the ratio of the frequency of the digital signal (e.g., a frequency associated with timestamps) provided to phase/frequency detector 124 to the frequency of input clock signal CLKIN.

In at least one embodiment, fractional frequency divider 220 includes analog frequency divider 202, which receives input clock signal CLKIN. Analog frequency divider 202 generates analog clock signal CLKDIV using integer divider code INTEGER. Integer divider code INTEGER is a dynamically changing integer value having an average value that equals divider code DIVVAL. In at least one embodiment, integer divider code INTEGER can be integer N or integer N+1 corresponding to divider code DIVVAL (e.g., floor (DIVVAL) or ceiling (DIVVAL)). In at least one embodiment, error correction circuit 208 provides fractional divider code FRAC, which is an error correction value that corresponds to a phase error of analog clock signal CLKDIV in units of digital signal CLKIN_PERIOD. Measurement circuit 320 generates digital signal CLKIN_PERIOD, which is a digital representation of the period of input clock signal CLKIN and in some embodiments is based on an average of the first difference of timestamp TSTAMP divided by divider code DIVVAL. Multiplier 210 generates fractional timestamp TSTAMP_FRAC based on the product of digital signal CLKIN_PERIOD and fractional divider code FRAC, which is used to correct an error in the phase of analog clock signal CLKDIV and timestamp TSTAMP_INT. Error correction circuit 208 controls the update rate of integer divider code INTEGER and fractional timestamp TSTAMP_FRAC using analog clock signal CLKDIV. Note that in other embodiments of phase-locked loop 300, an additional time-to-digital converter is used to generate digital representations of the period of input clock signal CLKIN and measurement circuit 320 provides digital signal CLKIN_PERIOD based on those digital representations.

In at least one embodiment, fractional frequency divider 220 converts input clock signal CLKIN into a stream of digital values in response to integer divider code INTEGER, provided by error correction circuit 208. Analog frequency divider 202 provides analog clock signal CLKDIV, which is an integer divided version of input clock signal CLKIN, to time-to-digital converter 204. Time-to-digital converter 204 converts analog clock signal CLKDIV to a corresponding stream of digital values (e.g., timestamps TSTAMP_INT). In at least one embodiment time-to-digital converter 204 generates timestamp TSTAMP_INT by capturing a counter value coincident with a rising edge of analog clock signal CLKDIV. The counter of time-to-digital converter 204 updates in response to a control clock signal having a high frequency (i.e., a frequency one or more orders of magnitude higher than the frequency of input clock signal CLKIN or output clock signal CLKOUT). In at least one embodiment of fractional frequency divider 220, time-to-digital converter 204 is implemented using techniques described in U.S. Pat. No. 10,067,478, issued Sep. 4, 2018, entitled "Use of a Recirculating Delay Line with a Time-to-Digital Converter," naming Raghunandan Kolar Ranganathan as inventor, which application is incorporated herein by reference.

Summer 212 combines timestamp TSTAMP_INT, which is a digital representation of analog clock signal CLKDIV with timestamp TSTAMP_FRAC, which is a digital representation of an error between the phase of analog clock signal CLKDIV and a frequency-divided version of input clock signal CLKIN frequency-divided by the real number specified by digital code DIVVAL. Summer 212 generates timestamp TSTAMP, which is an error-corrected version of timestamp TSTAMP_INT. Timestamp TSTAMP is a digital representation of input clock signal CLKIN frequency-divided by a real value represented by divider value DIVVAL. Fractional frequency divider 220 provides timestamp TSTAMP to digital phase/frequency detector 124. The resulting timestamp TSTAMP is not afflicted by the jitter that is introduced by conventional fractional frequency dividers. Thus, phase/frequency detector has a reduced required full-scale range, phase-locked loop 300 can have a wider bandwidth, and an exemplary clock generator application including phase-locked loop 300 has a reduced loss-of-frequency lock detection time. Any noise contribution of timestamp TSTAMP_FRAC can be made negligible in comparison to timestamp TSTAMP_INT since timestamp TSTAMP_FRAC is a digitally calculated value.

Figure 4:
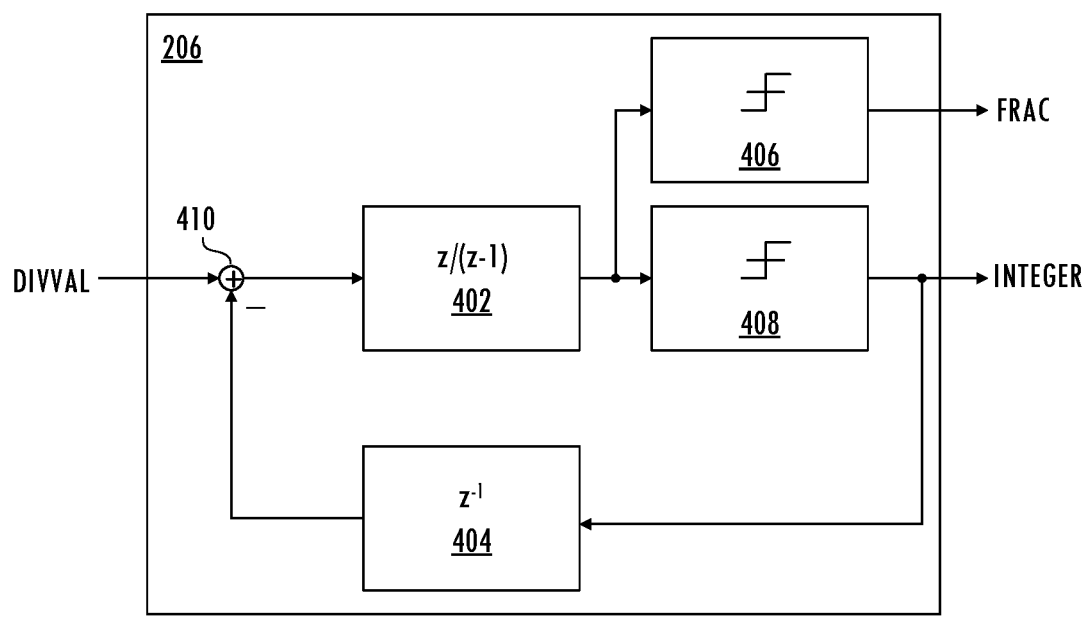
FIG. 4 illustrates a functional block diagram of an exemplary delta-sigma modulator of the fractional dividers of FIGS. 3 and 5.

In at least one embodiment, error correction circuit 208 includes first-order delta-sigma modulator 206 that generates integer divider code INTEGER and fractional divider code FRAC with sufficient precision from divider value DIVVAL. FIG. 4 illustrates an exemplary functional block diagram of delta-sigma modulator 206, which includes integrator 402, delay element 404, and multi-bit quantizers 406 and 408. Summer 410 generates a difference between a prior value of integer divider code INTEGER provided by delay element 404 and divider value DIVVAL.

Referring to FIG. 3, in some embodiments, phase-locked loop 300 includes an analog frequency divider 222 that generates a version of output clock signal CLKOUT that is integer divided according to an integer-valued feedback divider code FBK_DIVVAL. Time-to-digital converter 205 converts feedback clock signal FBCLK to a timestamp FB_TSTAMP, and provides the digital value (e.g., timestamp FB_TSTAMP) to digital phase/frequency detector 124. Digital phase/frequency detector 124 generates a digital phase difference signal that is used by digital loop filter 126 and digitally-controlled oscillator 128 to generate output clock signal CLKOUT having a frequency that is related to the frequency of input clock signal CLKIN according to ratios specified by divider code DIVVAL and feedback divider code FBK_DIVAL.

Figure 5:
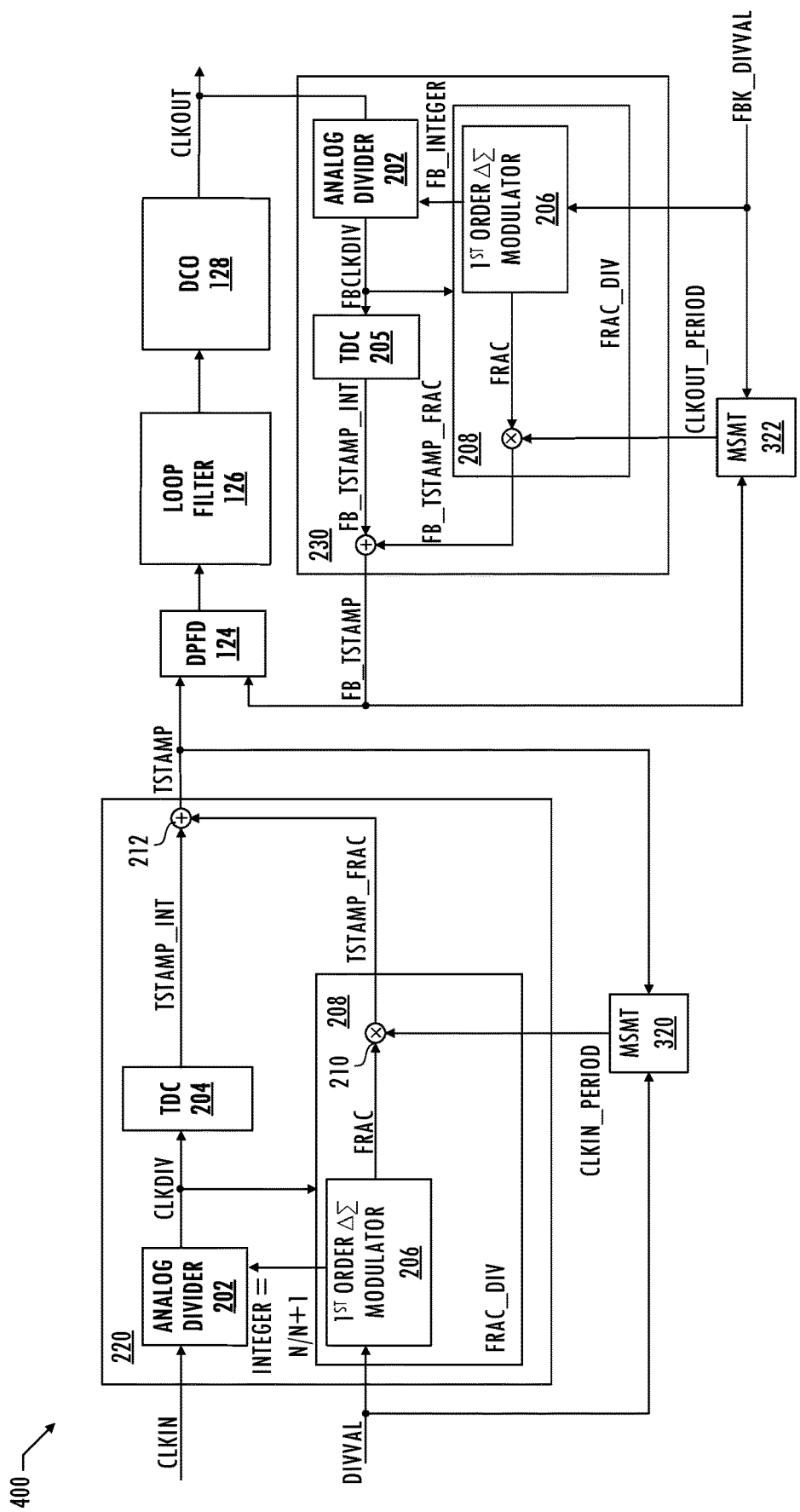
FIG. 5 illustrates a functional block diagram of a phase-locked loop including a digital phase/frequency detector and an input fractional frequency divider with error correction and a feedback fractional frequency divider with error correction consistent with at least one embodiment of the invention.

In at least one embodiment of a phase-locked loop, the feedback divider value FBK_DIVAL represents a real number (i.e., a number having an integer portion and a fractional portion) that indicates a ratio of the frequency of the digital signal provided to phase/frequency detector 124 to the frequency of output clock signal CLKOUT. Referring to FIG. 5, fractional frequency divider 230, which is similar to fractional divider 220, is included in the feedback path of phase-locked loop 400. Fractional divider 230 frequency-divides output clock signal CLKOUT by a real-valued number indicated by feedback divider code FBK_DIVVAL, by combining a timestamp corresponding to an integer-divided version of output clock signal CLKOUT and an error correction timestamp corresponding to a digital clock period multiplied by a fractional divider code corresponding to the error.

The summer generates timestamp FB_TSTAMP, which corresponds to a digital feedback clock signal that is the frequency-divided version of output clock signal CLKOUT. Measurement circuit 322 generates digital signal CLKOUT PERIOD, which is a digital representation of the period of output clock signal CLKOUT based on an average of the first difference of timestamp FB_TSTAMP divided by divider code FBK_DIVVAL. Fractional frequency divider 230 provides timestamp FB_TSTAMP to phase/frequency detector 124 for generation of a digital phase difference signal used to generate output clock signal CLKOUT having a frequency that is related to the frequency of input clock signal CLKIN according to ratios specified by divider code DIVVAL and feedback divider code FBK_DIVAL. In fractional frequency divider 230, error correction circuit 208 controls the update rate of integer divider code FB INTEGER and fractional timestamp FB_TSTAMP_FRAC using analog clock signal FBCLKDIV. The resulting timestamp FB_TSTAMP is not afflicted by the jitter that is introduced by conventional fractional frequency dividers. Thus, phase/frequency detector 124 has a reduced required full-scale range, phase-locked loop 300 can have a wider bandwidth, and an exemplary clock generator application including phase-locked loop 400 has a reduced loss-of-frequency lock detection time as compared to those including phase-locked loops using conventional fractional-frequency dividers. Any noise contribution of timestamp FB_TSTAMP_FRAC can be made negligible in comparison to timestamp FB_TSTAMP_INT since timestamp FB_TSTAMP_FRAC is a digitally calculated value.

Thus, techniques that reduce the phase/frequency detector full-scale range, enable widening of the phase-locked loop bandwidth, and reduces loss of frequency lock detection time in clock generator applications have been disclosed. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative and is not intended to limit the scope of the invention as set forth in the following claims. For example, while the invention has been described in embodiments in which timestamps are used as digital representations of clock signals, one of skill in the art will appreciate that the teachings herein can be utilized with other digital representations of clock signals. For example, although time-to-digital converter 204 is described in embodiments that generate timestamps that generally increase in value (i.e., a counter in the time-to-digital converter does not reset after each time-to-digital conversion cycle) and measurement circuit 320 determines an associated clock period based on a difference between consecutive timestamps, in other embodiments, a time-to-digital converter outputs a digital value representing a period between corresponding clock edges of the input clock signal in unit intervals of a counter control clock signal and the counter resets to an initial value after each corresponding clock edge (e.g., each rising edge of the input clock signal or each falling edge of the input clock signal) and an associated measurement circuit does not compute a difference between consecutive digital values. The terms "first," "second," "third," and so forth, as used in the claims, unless otherwise clear by context, is to distinguish between different items in the claims and does not otherwise indicate or imply any order in time, location or quality. Variations and modifications of the embodiments disclosed herein may be made based on the description set forth herein, without departing from the scope of the invention as set forth in the following claims.

What is claimed is:

1. A clock product comprising:
    a phase-locked loop configured to generate an output clock signal based on an input digital value and a feedback digital value, the input digital value corresponding to a first clock edge of a frequency-divided input clock signal and the feedback digital value corresponding to a second clock edge of a feedback clock signal; and
    an input fractional divider comprising:
        an analog divider configured to generate an integer-divided clock signal based on an input clock signal and an integer divider code;
        a time-to-digital converter configured to generate an integer-divided clock digital value based on the integer-divided clock signal;
        an error correction circuit configured to generate the integer divider code and a fractional digital value based on a divider value and an input clock period digital code corresponding to a period of the input clock signal; and
        a summer configured to generate the input digital value based on the integer-divided clock digital value and the fractional digital value.

2. The clock product, as recited in claim 1, wherein the divider value is fractional.

3. The clock product, as recited in claim 1, wherein the time-to-digital converter is a counter responsive to a control clock signal, the control clock signal having a first frequency, the first frequency being substantially greater than a second frequency of the integer-divided clock signal.

4. The clock product, as recited in claim 1, wherein the error correction circuit comprises a delta-sigma modulator configured to generate the integer divider code and a fractional divider code based on the divider value.

5. The clock product, as recited in claim 4, wherein the error correction circuit further comprises:
    a multiplier configured to generate the fractional digital value based on the fractional divider code and the input clock period digital code.

6. The clock product, as recited in claim 1, further comprising:
    a clock period measurement circuit configured to generate the input clock period digital code based on the divider value and an average of first differences of the input digital value.

7. The clock product, as recited in claim 1, wherein the phase-locked loop comprises:
    a digital phase/frequency detector configured to generate a digital phase difference signal based on the input digital value and the feedback digital value;
    a digital loop filter configured to generate a digital control signal based on the digital phase difference signal;
    a digitally-controlled oscillator configured to generate the output clock signal based on the digital control signal; and
    a fractional feedback divider configured to generate the feedback digital value based on the output clock signal, a feedback divider value, and an output clock period digital code corresponding to a second period of the output clock signal.

8. The clock product, as recited in claim 1, wherein the phase-locked loop comprises:
    a digital phase/frequency detector configured to generate a digital phase difference signal based on the input digital value and the feedback digital value;
    a digital loop filter configured to generate a digital control signal based on the digital phase difference signal;
    a digitally-controlled oscillator configured to generate the output clock signal based on the digital control signal;
    a feedback divider configured to generate the feedback clock signal based on the output clock signal; and
    a second time-to-digital converter configured to generate the feedback digital value.

9. The clock product, as recited in claim 8, wherein the feedback divider is a fractional feedback divider comprising:
    a second analog divider configured to generate an integer-divided feedback clock signal based on the output clock signal and an integer feedback divider code;
    a third time-to-digital converter configured to generate an integer-divided feedback clock digital value based on the integer-divided feedback clock signal;
    a second error correction circuit configured to generate the integer feedback divider code and a fractional feedback digital value based on a feedback divider value and an output clock period digital code; and
    a second summer configured to generate the feedback digital value based on the integer-divided feedback clock digital value and the fractional feedback digital value.

10. The clock product, as recited in claim 1, further comprising:
    a second time-to-digital converter circuit configured to generate a clock digital value based on the input clock signal; and
    a clock period measurement circuit configured to generate the input clock period digital code based on an average of first differences of the clock digital value.

11. A method for generating a clock signal, the method comprising:
    generating an output clock signal based on an input digital value and a feedback digital value, the input digital value corresponding to a first clock edge of a frequency-divided input clock signal and the feedback digital value corresponding to a second clock edge of a feedback clock signal; and
    generating the input digital value, wherein generating the input digital value comprises:
        generating an integer-divided clock signal based on an input clock signal and an integer divider code;
        generating an integer-divided clock digital value based on the integer-divided clock signal;
        generating the integer divider code and a fractional digital value based on a divider value and an input clock period digital code corresponding to a period of the input clock signal; and
        generating the input digital value based on the integer-divided clock digital value and the fractional digital value.

12. The method, as recited in claim 11, wherein generating the fractional digital value comprises delta-sigma modulating the divider value to generate the integer divider code and a fractional divider code used to generate the fractional digital value.

13. The method, as recited in claim 12, wherein generating the fractional digital value further comprises multiplying the fractional divider code and the input clock period digital code to generate the fractional digital value.

14. The method, as recited in claim 11, wherein generating the output clock signal comprises:
    generating a digital phase difference signal based on the input digital value and the feedback digital value;

generating a digital control signal based on the digital phase difference signal;

generating the output clock signal based on the digital control signal;

generating a frequency-divided feedback clock signal based on the output clock signal and a feedback divider value; and generating the feedback digital value based on the frequency-divided feedback clock signal.

15. The method, as recited in claim 11, wherein generating the output clock signal comprises:

generating a digital phase difference signal based on the input digital value and the feedback digital value;

generating a digital control signal based on the digital phase difference signal;

generating the output clock signal based on the digital control signal; and generating the feedback digital value based on the output clock signal, a feedback divider value, and an output clock period digital code corresponding to a second period of the output clock signal.

16. The method, as recited in claim 15, wherein generating the feedback digital value comprises:

generating an integer-divided output clock signal based on the output clock signal and an integer feedback divider code;

generating an integer-divided feedback clock digital value based on the integer-divided output clock signal;

generating the integer feedback divider code and a fractional feedback digital value based on the feedback divider value and the output clock period digital code; and summing the integer-divided feedback clock digital value and the fractional feedback digital value to generate the feedback digital value.

17. The method, as recited in claim 11, further comprising:

averaging first differences of the input digital value to generate an average value; and dividing the average value by the divider value to generate the input clock period digital code.

18. The method, as recited in claim 11, further comprising:

generating a clock digital value based on the input clock signal; and averaging first differences of the clock digital value to generate the input clock period digital code.

19. A method for generating a clock signal comprising:

generating an output clock signal based on an input digital value and a feedback digital value, the input digital value corresponding to a first clock edge of a frequency-divided input clock signal and the feedback digital value corresponding to a second clock edge of a feedback clock signal; and generating the feedback digital value, wherein generating the feedback digital value comprises:

generating an integer-divided feedback clock signal based on the output clock signal and an integer divider code;

generating an integer-divided feedback clock digital value based on the integer-divided feedback clock signal;

generating the integer divider code and a fractional feedback digital value based on a feedback divider value and an output clock period digital code corresponding to a period of the output clock signal; and generating the feedback digital value based on the integer-divided feedback clock digital value and the fractional feedback digital value.

20. The method, as recited in claim 19, further comprising:

averaging first differences of the feedback digital value to generate an average value; and dividing the average value by the feedback divider value to generate the output clock period digital code.

* * * * *